(12) United States Patent
Tudosoiu et al.

(10) Patent No.: US 7,738,539 B2
(45) Date of Patent: *Jun. 15, 2010

(54) CURRENT CONSUMPTION REDUCTION WITH LOW POWER AMPLIFIER

(75) Inventors: Bogdan Tudosoiu, Lund (SE); Phillip Marc Johnson, Raleigh, NC (US); William O. Camp, Jr., Chapel Hill, NC (US)

(73) Assignee: Sony Ericsson Mobile Communications AB, Lund (SE)

( * ) Notice: Subject to any disclaimer, the term of this patent is extended or adjusted under 35 U.S.C. 154(b) by 795 days.

This patent is subject to a terminal disclaimer.

(21) Appl. No.: 11/565,925

(22) Filed: Dec. 1, 2006

(65) Prior Publication Data

US 2008/0130786 A1  Jun. 5, 2008

(51) Int. Cl.
   *H04B 1/38*  (2006.01)
(52) U.S. Cl. ...................... 375/219; 375/267
(58) Field of Classification Search ......... 375/219–220, 375/267, 297, 299
   See application file for complete search history.

(56) References Cited

U.S. PATENT DOCUMENTS

| | | | | |
|---|---|---|---|---|
| 5,701,595 | A * | 12/1997 | Green, Jr. .................... | 455/83 |
| 6,615,028 | B1 | 9/2003 | Loke et al. | |
| 7,236,807 | B1 * | 6/2007 | Shapira et al. ........... | 455/562.1 |
| 2002/0103001 | A1 * | 8/2002 | Weissman .................. | 455/524 |
| 2002/0114038 | A1 * | 8/2002 | Arnon et al. ................ | 359/145 |
| 2003/0186660 | A1 * | 10/2003 | Lee ............................ | 455/140 |
| 2004/0038660 | A1 | 2/2004 | He et al. | |
| 2004/0082354 | A1 * | 4/2004 | Cohen ........................ | 455/522 |
| 2004/0087332 | A1 * | 5/2004 | Monroe et al. .............. | 455/524 |
| 2005/0227631 | A1 * | 10/2005 | Robinett ...................... | 455/83 |
| 2006/0028269 | A1 | 2/2006 | Chen | |
| 2006/0035600 | A1 | 2/2006 | Lee et al. | |
| 2006/0052065 | A1 * | 3/2006 | Argaman et al. ........... | 455/101 |
| 2006/0223577 | A1 * | 10/2006 | Ouzillou .................. | 455/553.1 |
| 2006/0250182 | A1 | 11/2006 | Takeda et al. | |
| 2007/0052599 | A1 * | 3/2007 | Shimizu et al. ............. | 343/702 |
| 2007/0103645 | A1 * | 5/2007 | Takeuchi et al. ............. | 353/31 |
| 2007/0153937 | A1 * | 7/2007 | Itkin et al. .................. | 375/297 |
| 2008/0002787 | A1 * | 1/2008 | Zipper et al. ................ | 375/297 |

FOREIGN PATENT DOCUMENTS

EP    0 837 559 A1    4/1998

OTHER PUBLICATIONS

PCT/EP2007/054704 International Search Report with Written Opinion, Jul. 23, 2007, 11 pages.

* cited by examiner

*Primary Examiner*—Emmanuel Bayard
(74) *Attorney, Agent, or Firm*—Harrity & Harrity, LLP

(57) ABSTRACT

A transceiver circuit and a method in a wireless communication network are provided, where a signal power level for a signal received at the transceiver circuit is measured and compared to a predefined threshold power level. At least two groups of power amplifiers may be used, where one group is optimized for high efficiency above the predefined threshold power level, and one group is optimized for high efficiency below the predefined threshold power level. The amplifiers may be used to amplify the received signal depending on the signal power level in relation to the predefined power threshold level. The signal may then be filtered by duplex filters and forwarded to a diversity antenna or a main antenna where it is transmitted over an air interface.

16 Claims, 6 Drawing Sheets

CURRENT CONSUMPTION REDUCTION WITH LOW POWER AMPLIFIER

TECHNICAL FIELD

The present invention relates to current consumption reduction in wireless communication networks.

BACKGROUND OF THE INVENTION

The development of 3G wireless communication networks by standards, such as HSPDA (High Speed Packet Data Access), EUL (Enhanced Uplink) will allow for higher data rates on the downlink channel (from the base station to the mobile station) and on the uplink channel (from the mobile station to the base station) and further on towards LTE/SAE (Long-Term Evolution/System Architecture Evolution).

HSPDA will for example allow for peak data rates up to 10 Mbit/s, shorter connection and response times and a huge increase in sector throughput, while the EUL will increase uplink data rates in a later HSPDA release. LTE/SAE, in turn, will offer similar advantages.

Nonetheless, while these advantages will benefit end-users and the use of resource hungry mobile applications, the improvements are in conflict with other parameters important in such wireless communication networks, such as current consumption both in the mobile stations and the base stations, volume, and others.

One attempt of dealing with the increased power consumption is the introduction of power amplifiers adapted to have high efficiency at high output powers and power amplifiers with high efficiency at lower output powers as shown in FIG. 1.

Here, the amplifier circuit comprises one amplifier for high output power and one for lower output powers, i.e., around 15 dBm. Even though the current consumption through this arrangement is reduced with respect to only one power amplifier, there is still room for reducing the current consumption even more and particularly for saving battery power in diversity systems, be it in receiver or transmitter diversity systems, or both.

Aspects of the invention provide an alternative way of reducing the current consumption in a mobile station or an access point in a wireless communication network.

SUMMARY OF THE INVENTION

One aspect of the invention provides a transceiver for wireless communication networks. The transceiver comprises: at least one transceiver module for determining the signal power to be transmitted; a unit for directing one or more signals whose determined signal power is above a certain power threshold to one or more first amplifiers with high efficiency above the power threshold and one or more signals whose determined signal power is below the power threshold to one or more second amplifiers with high efficiency at signal powers below the power threshold; an isolation arrangement connected to the one or more first amplifiers for preventing signal reflections of the signals amplified by the one or more first amplifiers; and at least one first diversity antenna and at least one first main antenna for transmitting the amplified signals.

One advantage of the transceivers according to the present invention is the tangible reduction in current consumption and the flexibility of its use in virtually any diversity transceiver circuit.

Furthermore, another aspect of the invention provides a method for amplifying signal in a wireless communication network which comprises the steps of: a) receiving one or more signals, b) determining the power at which the one or more received signals are to be sent, c) comparing the power at which the which the one or more received signals are to be sent to a predefined power threshold, d) directing one or more signals whose power is above a certain power threshold to one or more first amplifiers with high efficiency above the power threshold power, and one or more signals below the power threshold to one or more second amplifiers with high efficiency at signal powers below the power threshold, e) amplifying the signal in the one or more first amplifiers, f) sending the amplified signal to at least one first diversity antenna or to at least one main antenna and g) transmitting the one or more signals over the radio interface via the at least one first diversity antenna or at least one first main antenna.

The method may be specially adapted to be implemented by the transceiver according to the present invention. Also, the steps of the method according to the present invention may be executed by a computer program running either on the transceiver of the present invention or on a separate storage medium.

BRIEF DESCRIPTION OF THE DRAWINGS

Optional

DETAILED DESCRIPTION OF PREFERRED EMBODIMENTS

In the following detailed description, reference numbers depicting identical elements in different figures will not be repeated for each figure for the purposes of easier reading.

Figure 1:
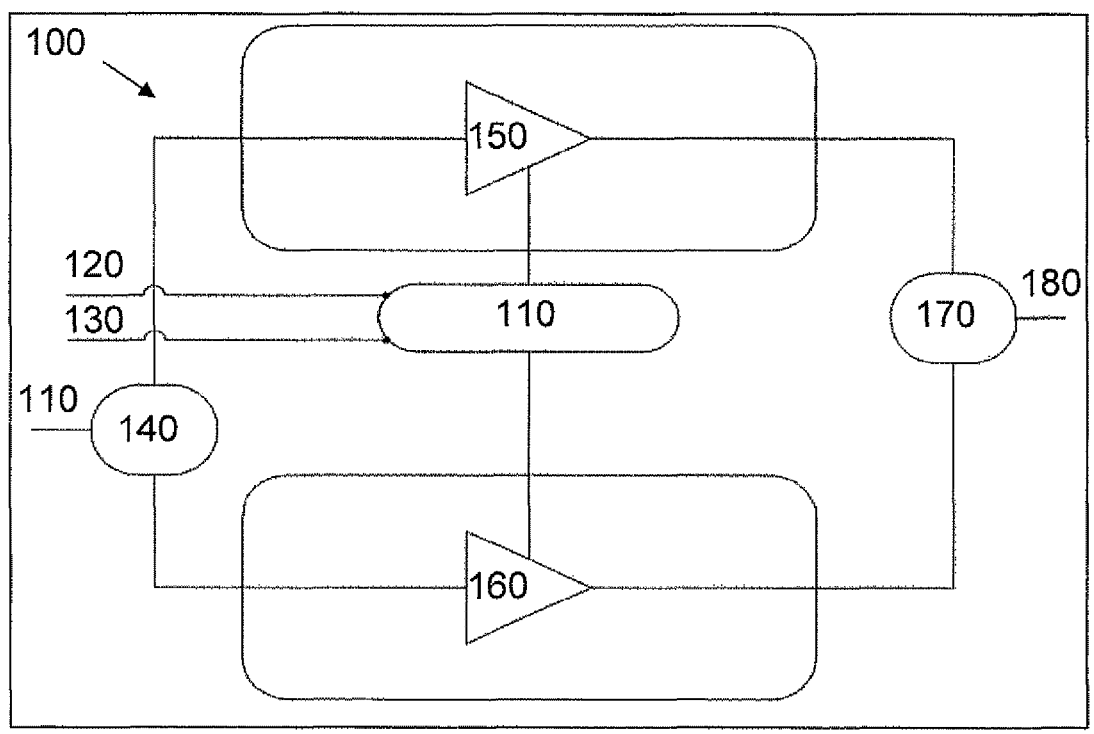
FIG. 1 illustrates an amplifier circuit according to known technology.

FIG. 1 gives an illustration of an amplifier circuit 100 where it is attempted to reduce the current consumption in a mobile station or base station according to known technology.

Referring to FIG. 1, an RF input signal 110 is fed into a splitter 140 and directed to the input of a first power amplifier 150 and a second amplifier 160. The first amplifier 150 is trimmed for high efficiency at high output powers, while the second amplifier 160 is adapted for high efficiency at lower output powers, such as, for example, 15 dBm or lower.

Depending on whether it is desired to output only the high power amplified RF signal from the first amplifier 150 or the lower power amplified RF signal from the second amplifier 160, a mode splitter 110 uses a control signal to make either the first amplifier 150 or the second amplifier 160 output the amplified signal. The two control signals used for controlling the power amplifier outputs are a first mode signal 120 and a second mode signal 130 corresponding to high power RF signals and lower power RE signals. Naturally, it may also be possible to combine both the amplified high power part of the input RF signal and the lower power part RE input signal in a combiner 170 in an amplified RE output signal 180.

It should be noted that normally, the transceiver according to the present invention illustrated in FIGS. 2-5 may be implemented in any mobile device operating in a wireless communication network, such as a mobile station, a wireless network card, PDA and similar devices, as well as in a base station, access point, Node B or similar access points in a wireless communication network.

Figure 2:
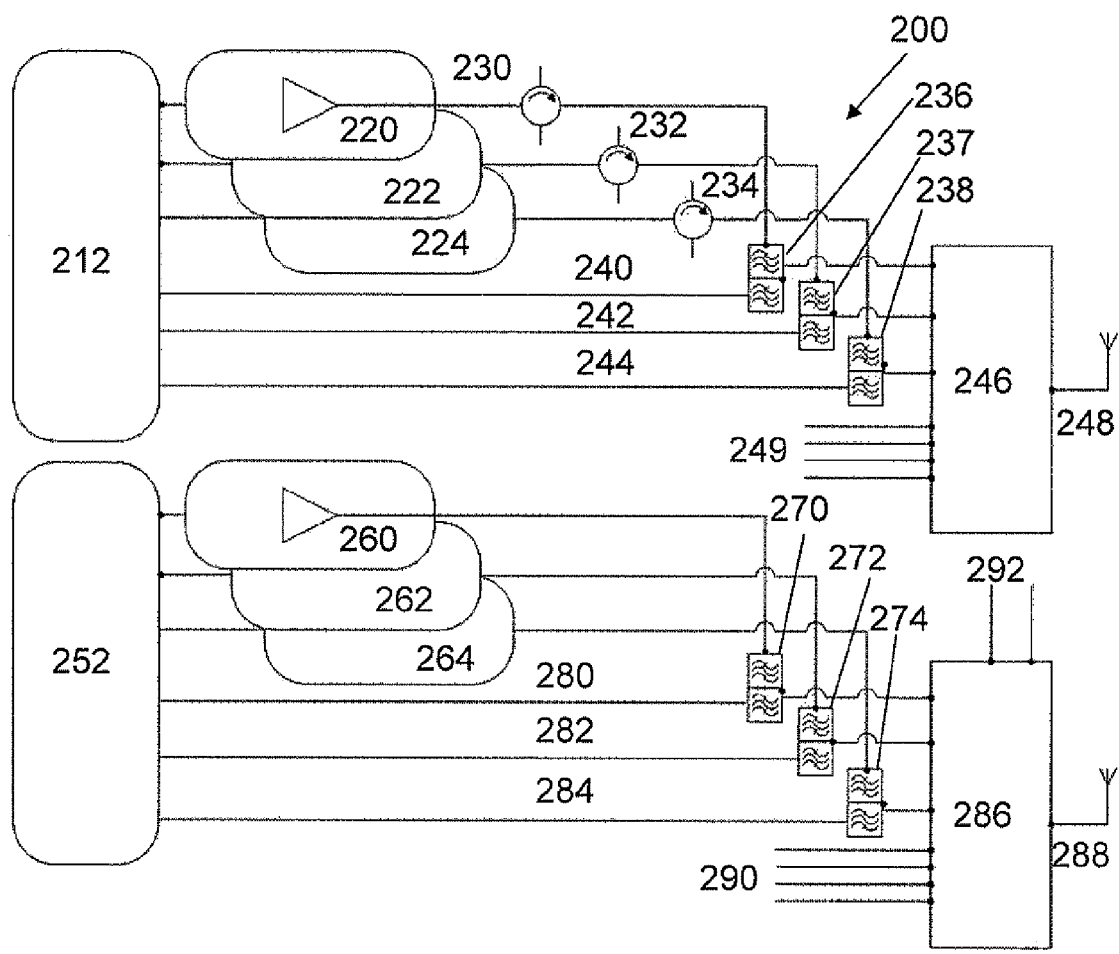
FIG. 2 illustrates a transceiver circuit according to a first embodiment of the present invention.

Turning now to FIG. 2, a transceiver circuit 200 according to a first embodiment of the present invention is shown.

The transceiver circuit 200 comprises a diversity transceiver module 212 which among other things is used for determining the power level at which an incoming signal is going to be transmitted. Furthermore, the diversity transceiver module 212 is connected to a first group of power amplifiers (in this case three) 220, 222, 224 trimmed for high efficiency at high output powers, such as, for example 24 dBm or above. Also, the first group of power amplifiers 220, 222, 224 for high output powers are each connected to a first group of circulators 230, 232, 234 having among other things the function of an isolator for preventing signal reflections of an RF signal from the first antenna circuit 246. Using a circulator as an isolation circuit would reduce the output power by approximately 0.4 dB Each circulator 230, 232, 234, is in turn connected to a first group of duplexers 240, 242, 244 which may comprise band pass filters for signals to be transmitted over the air interface and band pass filters for signals received over the same. These duplexers additionally provide high isolation between bands of interest and are therefore used for filtering the interesting part of the signal.

It should be mentioned here, that it is assumed that the signals to be amplified are Wideband Carrier Division Multiplex Multiple Access (WCDMA) or 3G signals to be sent over the air interface. However, it is also possible to feed combined GSM/EDGE and WCDMA signals as well as Long Term Evolution (LTE)-signals, such as Orthogonal Frequency Division Multiplex (OFDM) or Single Carrier—Frequency Division Multiple Access (SC-FDMA) to the first group of power amplifiers 220, 222 and 224 if the bandpass frequency filters 236, 237 and 238 are designed with a wide enough pass band.

Alternatively, the GSM/EDGE signals 249 which are not be amplified by the first group of power amplifiers 220, 222, 224 are fed directly into a diversity front-end module or, for example, a SPnT switch 246 before they are to be sent over the air interface via the diversity antenna 248. Here an SPnT switch is a Single Pole N Throw switch, N being the number of switching positions for the switch.

Also, the amplified and filtered radio signals are fed into the diversity front-end module 246 and sent over the air interface via the diversity antenna 248.

Furthermore, radio signals received from the diversity antenna 248 are filtered by the same first group of frequency filters 236, 237, 238 as above for removing undesired parts of the frequency spectrum before they are sent to the transceiver diversity module 212 via the connections 240, 242 and 244.

The main transceiver module 252 is connected in a very similar way to the second front-end module 286. In this case however, since the output power for the radio signals amplified in a second group of amplifiers 260, 262, 264 is lower than the output power for the radio signals amplified by the first group of amplifiers 220, 222, 224, isolators in the form of circulators are not needed. It may be added that the lower output power for the amplified radio signals reduces the Adjacent Channel Leakage Ratio (ACLR) and the Error Vector Magnitude (EVM), which describe the interference from neighboring channels to the amplified radio channel and the modulation distortion induced by the interference from other channels.

It should also be mentioned that the second group of amplifiers 260, 262, 264 are trimmed for high efficiency at lower power levels, such as, for example, 15 dBm or lower.

Additionally, the second group of amplifiers 260, 262, 264 is in turn connected to a second group of bandpass frequency filters 270, 272, 274. As described previously, these bandpass filers filter the interesting parts of the frequency spectrum for the amplified radio signals before they are sent to the main front-end module 286 and further over the radio interface via the main antenna 288.

Radio signals received on the main antenna 288 are also bandpass filtered by the second group of bandpass frequency filters before being forwarded as filtered signals 280, 282, 284 to the main transceiver module 252.

GSM/EDGE signals 290 not intended to be amplified by the second group of amplifiers 260, 262, 264 are fed via a separate input into the main front-end module and sent over the radio interface via the main antenna 288. In case only WCDMA signals are to be amplified by the first group of amplifiers 220, 222, 224 and the second group of amplifiers 262, 264, 266, GSM/EDGE signals are fed out from the main front-end module 286 via a separate output 292.

The transceiver circuit 200 in FIG. 2 was described as a diversity transceiver circuit. However, it would be equally possible to arrange the transceiver circuit as only having receiver diversity, which would necessitate a third antenna acting as a transmitting antenna. The details of such a transceiver circuit will not be explained here, since it is assumed that they would be known to the skilled person having access to this disclosure.

Figure 3:
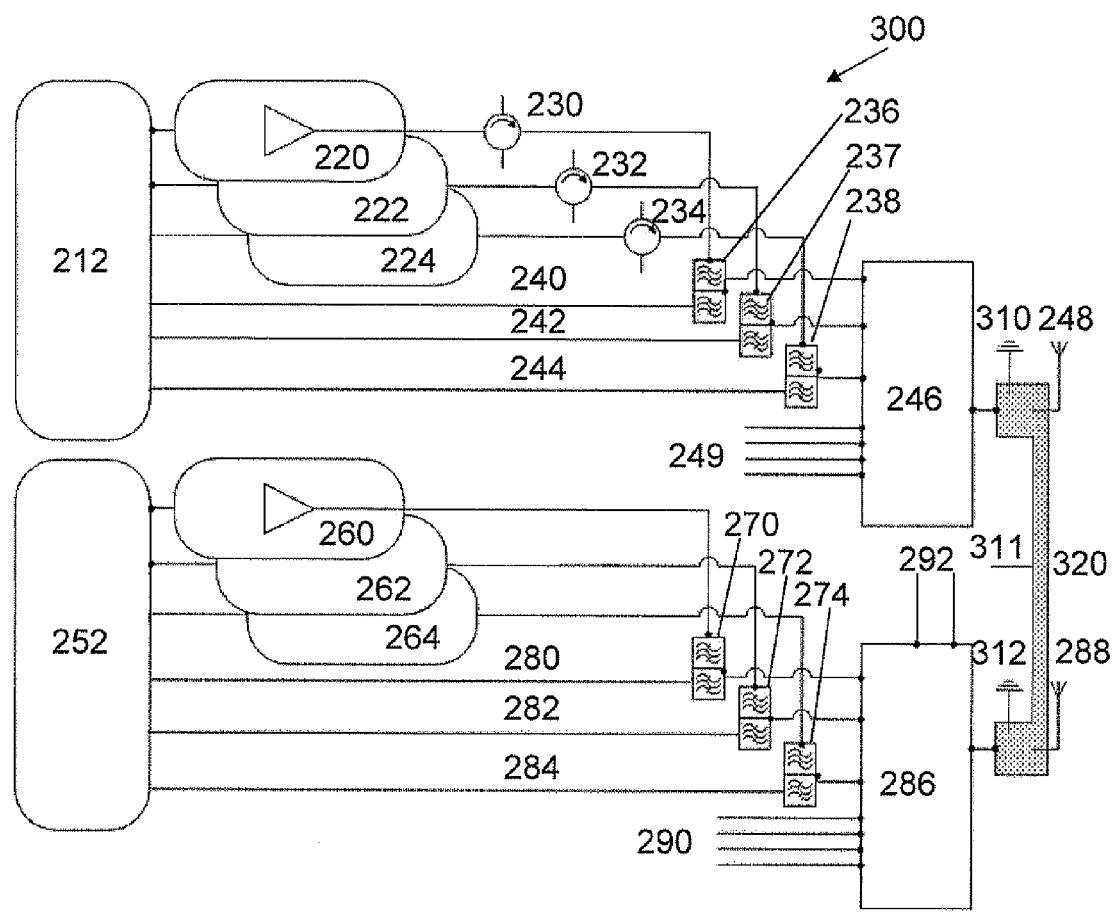
FIG. 3 illustrates a transceiver circuit according to a second embodiment of the present invention, where the transceiver comprises a DPDT switch.

FIG. 3 illustrates a transceiver circuit 300 according to a second embodiment of the present invention. Essentially, it is the same transceiver circuit 200 from FIG. 2 with the addition of a switch 320, which, for example may be a Double Pole Double Throw (DPDT) switch. The function of the elements present from FIG. 2 present in FIG. 2 will not be repeated here.

A DPDT switch usually consists of two switches switching between two well-defined states as is known to the skilled person. The DPDT switch 320 may be provided as a solid state switch or as an electrical switch, as preferred.

DPDT switch 320 may, depending on the control signal 310 activate the main antenna 288 and put the diversity antenna 248 to ground 310, 312 or vice versa. In this fashion, the active antenna will not be influenced by the other antenna and will therefore see more ground. One reason why it may be desirable for one of the antennas to see more ground is that in antenna design, a larger ground plane will result in more gain from the antenna connected to the ground plane, which in this specific case may either be the diversity antenna of the main antenna. This would also have the advantage that in small mobile stations where the ground plane is small or limited due to the physical dimensions of the mobile station, a ground plane extended by the switch would result in better antenna gain.

The active antenna may be coupled to one of the transceiver circuits; either the main transceiver circuit or the diversity transceiver circuit. However, it may also be possible to couple one of the antennas to the outputs of both transceiver circuits by using other types of switches.

Additionally, one may use other types of switches, such as a Singe Pole Single Throw (SPST) switches, (Double Pole Double Throw (DPDT) switches, Single Pole Double Throw (SPDT) switches, Single-Pole Change Over (SPCO) switches and other types of switches suitable for switching between the one first diversity antenna and the one first main antenna.

Figure 4:
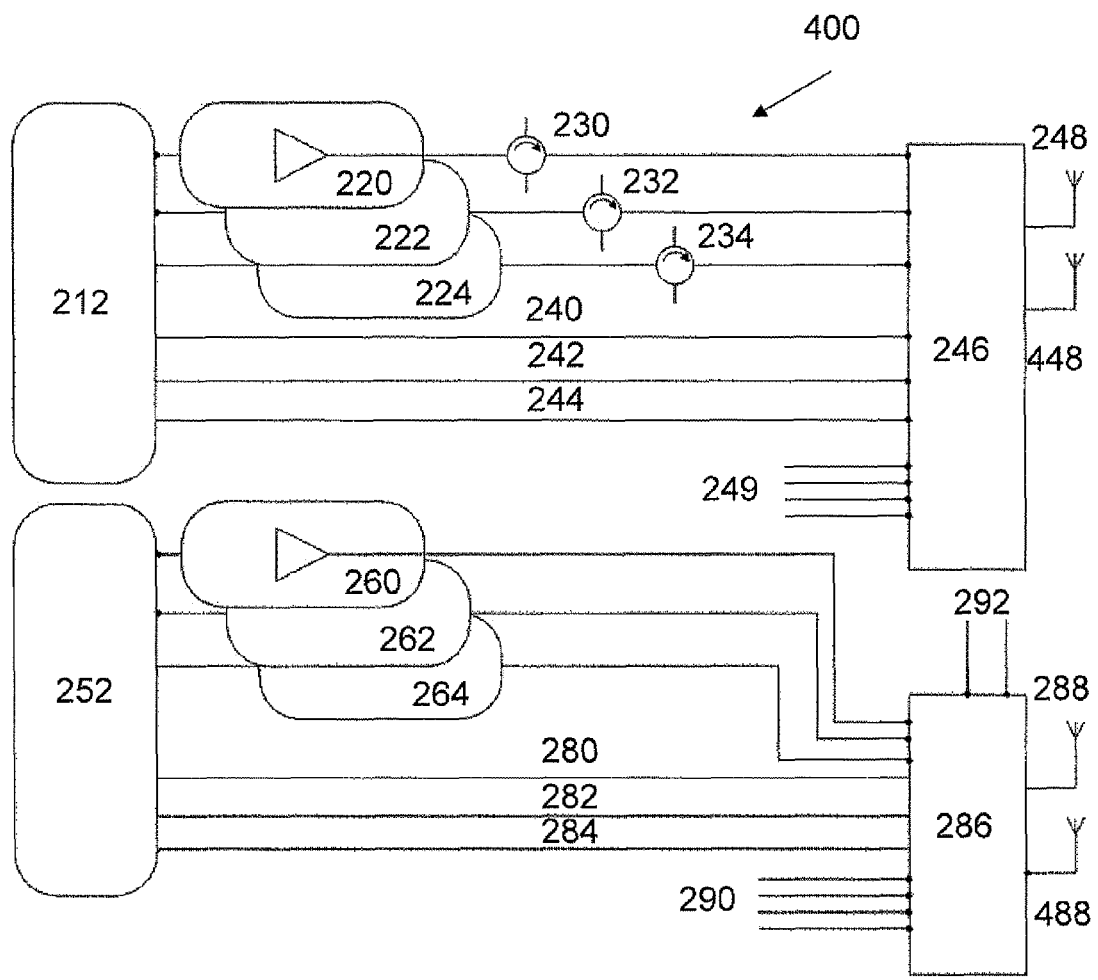
FIG. 4 illustrates a transceiver circuit in a MIMO (Multiple Input Multiple Output) or MISO (Multiple Input Single Output) system according to a third embodiment of the present invention.

Turning now to FIG. 4, a transceiver circuit 400 according to a third embodiment of the present invention is illustrated. In this embodiment, we have the same transceiver as in FIG. 2 applied to a multiple input, multiple output (MIMO) or a multiple input, multiple output (MISO) system.

In contrast to the embodiments in FIGS. 2 and 3, each front end module 246, 286 has its own receiver antennas 248, 288 and transmitter antennas 448, 488. Thus, since signals are transmitted and received via different antennas, frequency filters 236, 237, 238 and 270, 272, 274 for separation of uplink from downlink signals are no longer needed.

The example MIMO or MISO transceiver system 400 may of course comprise more than two sets of receiver and transmitter antennas 248, 288 and 448, 488, depending on the application.

Figure 5:
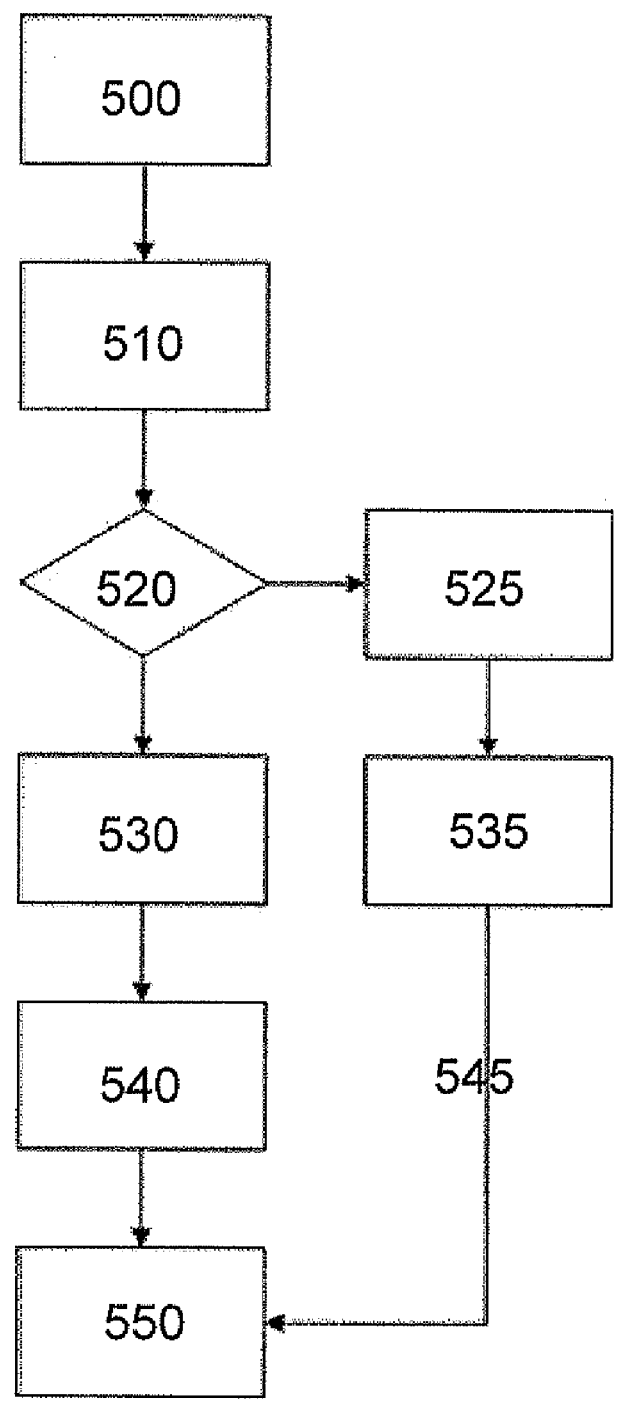
FIG. 5 illustrates the steps of a method according to one embodiment of the present invention.

FIG. 5 illustrates the steps of a method according to one embodiment of the present invention. At step 500, one or more signals are received at a transceiver circuit which may be one of the transceiver circuits 200, 300 or 400 described above or some modification of these circuits consistent with aspects of the transceiver circuits described above and consistent with the present invention.

Next, at step 510, in one of the transceiver modules 212, 252 the power level at which the one or more received signals are to be transmitted, is determined. This may however be done earlier in a DC/DC converter before the signal has arrived at one of the transceiver modules (not shown). Thereafter at step 520, the determined signal power level for the one or more received signals is compared with a predefined threshold power value. This threshold power value is chosen so that the first one group of amplifiers 220, 222, 224 is adapted to have maximum efficiency above this value, while the second one group of amplifiers 260, 262, 254 is adapted for maximum efficiency below the threshold power value. The comparison step 520 is needed to determine to which group of amplifiers the one or more signals should be sent in order to be amplified.

Therefore, if the signal power value for the one or more received signals is above the predefined threshold value it is sent to the first one group of amplifiers 220, 222, 224 at step 530

Thereafter, at step 540 the one or more received signals are amplified by the first one group of amplifiers 220, 222, 224 and sent further at step 540 to the diversity antenna 248 where they are transmitted over the air interface at step 550.

In contrast, if the signal power for the one or more received signals is determined to be below the predefined threshold power value, the one or more received signals are forwarded to the second one group of amplifiers 260, 262, 264 at step 525. Thereafter, the one or more signals are amplified by the second group of amplifiers 260, 262, 264 at step 535 and sent to the main antenna 288 at step 545.

It will be appreciated here, that in at least one embodiment of the transceiver according to the present invention (e.g., the second embodiment), the amplified one or more signals may be sent to either the diversity antenna 248 or the main antenna 288, as preferred.

Finally, at step 550 the thus amplified one or more signals are transmitted over the air interface via the main antenna 288.

Figure 6:
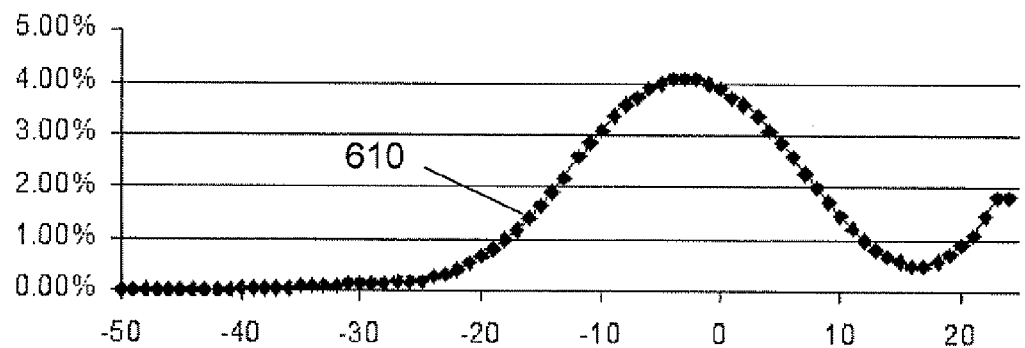
FIG. 6 shows a probability versus output power distribution in a CDMA2000 network.

FIG. 6 illustrates a probability versus output power distribution 610 taken from suburban profile measurements for the CDMA2000 system. The diagram shows the probability in percent of a certain output power expressed in dBm. Values above 24 dBm are not shown due to the power class constraints, meaning a transceiver sending WCMDA signals is not allowed to send signals with higher than 24 dBm+1/−3 dB (power class 3 constraint). As can be seen from the diagram, the output power will be mostly concentrated between −20 dBm and 15 dBm with a slight tail between 15 dBm and 25 dBm.

These figures are known to the skilled person and have been arrived at by experiment in many wireless networks in dedicated mode and are used in cell planning.

Using these figures however, simulations on the transceiver circuit according to the present invention have been performed with varying maximum power values for which the efficiencies of second group of power amplifiers 260, 262, 264 have been optimized.

Figure 7:
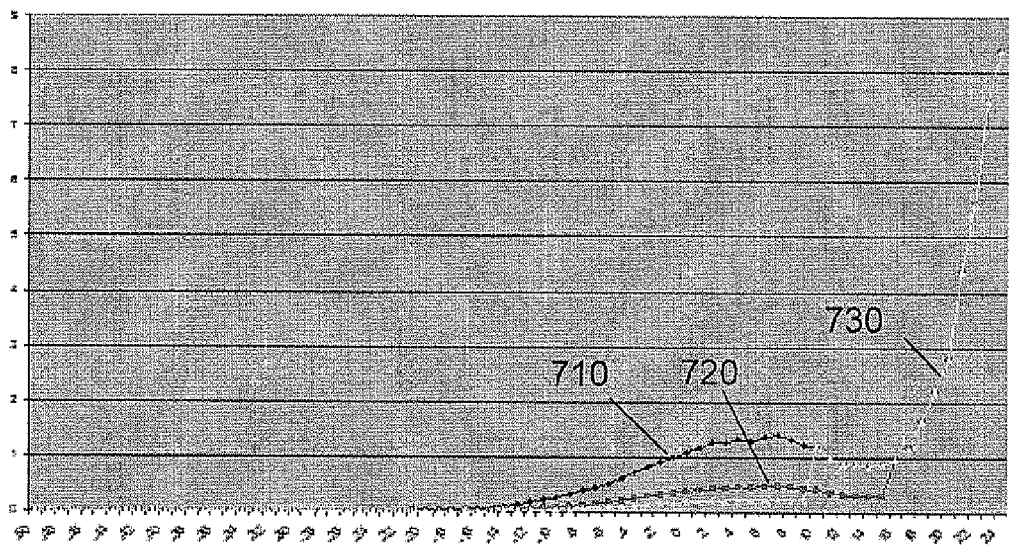
FIG. 7 shows a graph where the current consumption is shown as a function of output power for a transceiver according to the present invention.

The result of these simulations is shown in the graph in FIG. 7. Referring to FIG. 7, the graph shows the current consumption in mA as a function of output power in dBm for three scenarios. The first scenario comprised the use of a single power amplifier with maximum efficiency at maximum power and is illustrated by the curve 710.

It is evident that the current consumption lies around 0.8 mA for an output power in the interval −18 dBm to 16 dBm, while it rapidly rises between for output powers beyond 16 dBm.

The second scenario comprised two power amplifier groups, where the first group comprised power amplifiers trimmed for high efficiency at output powers above 15 dBm and power amplifiers trimmed for high efficiency at output power up to 15 dBm which is illustrated by the curve 720.

It is clearly visible that the average current consumption in the interval between −18 dBm and 15 dBm lies around 0.2 mA, before rapidly rising for an output effect beyond 15 dBm in a similar way as for the first scenario. The sudden jump in current consumption in the region between 15 dBm and 17 dBm may be explained by the fact that in this region the amplification switches from the lower power Power amplifier (PA) to the high power PA.

Finally, the third situation comprised a high power PA and a lower power PA with trimmed efficiency up to 9 dBm represented by the curve 730.

The sudden increase in current consumption is similar to the second scenario but (logically) kicks in between 9 dBm and 11 dBm. Later on, at around 16 dBm output power, the increase in current consumption becomes identical to the first and second scenarios.

Using known formulas for calculating the current consumption probability for all three scenarios, it was found that the average current consumption for the second and third scenarios where lower power PA optimized for high efficiency at lower powers are used, was reduced by 16 mA compared to the case of only one power amplifier at maximum output power. However the difference in current consumption between the second and third cases was only marginal.

It may be added that the transceiver according to the present invention may be employed in any wireless communication system, such as, for example, GSM, WCDMA, CDMA2000, Wireless Local Area Network (WLAN SPST), such as IEEE 802.11a, IEE 802.11b, IEEE 802.11g, Hiper-LAN, WINNER, WiMAX and other similar wireless communication systems.

Also the power amplifiers may consist of one amplifier component which usually is a solid state component, or comprise more than one amplifier component, depending on need. Although some power levels at which the power amplifiers have been designed to be highly efficient have been mentioned earlier in the description, they are given as example values only. It should be understood that the specific power levels for which the PAs are designed to be highly efficient depend on the application field and therefore may vary.

It should be emphasized that the term "comprises/comprising" when used in this specification is taken to specify the presence of stated features, integers, steps, or components, but does not preclude the presence or addition of one or more other features, integers, steps, components, or groups thereof.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based oil," as used herein is intended to mean "based, at least in part, on" unless explicitly stated otherwise.

The scope of the invention is defined by the claims and their equivalents.

The invention claimed is:

1. A transceiver for a wireless communication network, the transceiver comprising
    a transceiver module to determine a signal power for each of a plurality of signals to be transmitted, where the transceiver module determines that:
        a first signal, of the plurality of signals, is associated with a signal power above a particular power threshold, and
        a second signal, of the plurality of signals, is associated with a signal power below the power threshold;
    a directing unit to direct:
        the first signal to one or more first amplifiers, where said one or more first amplifiers have high efficiency at signal powers above the power threshold, and
        the second signal to one or more second amplifiers, where said one or more second amplifiers have high efficiency at signal powers below the power threshold;
    an isolation arrangement module, connected to the one or more first amplifiers, to prevent signal reflections of the first signal when amplified by the one or more first amplifiers; and
    an antenna module that includes a first diversity antenna and a first main antenna, the antenna module to transmit, as output signals, amplified signals received from at least one of the one or more first amplifiers or the one or more second amplifiers,
    where the first diversity antenna, and not the first main antenna, receives the first signal, when amplified by the one or more first amplifiers, and
    where the first main antenna, and not the first diversity antenna, receives the second signal, when amplified by the one or more second amplifiers.

2. The transceiver according to claim 1, where at least one of the first diversity antenna or the first main antenna is further to:
    receive input signals from other devices in the wireless communication network.

3. The transceiver according to claim 2, where the transceiver further comprises:
    a filter to separate the amplified signals, when transmitted via the antenna module, from the input signals.

4. The transceiver according to claim 1, further comprising another antenna module that includes:
    a second diversity antenna, and
    a second main antenna,
    the other antenna module to receive signals from other devices in the wireless communication network.

5. The transceiver according to claim 1, further comprising:
    a switch to select one of the first diversity antenna or the first main antenna to transmit the output signals.

6. The transceiver according to claim 5, where the switch is further to:
    connect, to ground, a non-selected one of the first diversity antenna or the first main antenna.

7. The transceiver according to claim 6, where the switch is one of:
    a singe pole single throw switch,
    a double pole double throw switch,
    a single pole double throw switch,
    a single pole change over switch, or
    other type of switch to change between the first diversity antenna and the first main antenna.

8. The transceiver according to claim 7, where the amplified signals from at least one of the one or more first amplifiers or the one or more second amplifiers include one of:
    wideband carrier division multiple access (WCDMA) signals, or
    combined global system for mobile communications/enhanced data rates for global evolution (GSM/EDGE) signals and WCDMA signals.

9. The transceiver according to claim 5, where the switch is one of:
    a singe pole single throw switch,
    a double pole double throw switch,
    a single pole double throw switch,
    a single pole change over switch, or
    another type of switch to change between the first diversity antenna and the first main antenna.

10. The transceiver according to claim 1, where the amplified signals from the one or more first amplifiers and the one or more second amplifiers are one of:
    WCDMA signals, or
    combined GSM/EDGE signals and WCDMA signals.

11. A method implemented by a transceiver in a wireless communication network, the method comprising:
    receiving a signal;
    determining a power at which the signal is to be sent;
    comparing the power at which the signal is to be sent to a particular power threshold;
    directing the signal, when the power is above the particular power threshold, to a first amplifier with high efficiency at signal powers above the particular power threshold
    directing the signal, when the power is below the particular power threshold, to a second amplifier with high efficiency at signal powers below the particular power threshold;
    amplifying the signal at the one of the first amplifier or the second amplifier to which the signal is directed;
    sending the amplified signal to one of a first diversity antenna or a first main antenna, where the first diversity antenna receives the amplified signal when amplified by the first amplifier, and where the first main antenna receives the amplified signal when amplified by the second amplifier; and
    transmitting the amplified signal over a radio interface via the first diversity antenna or the first main antenna to which the amplified signal is sent.

12. The method of claim 11, further comprising:
receiving a received signal from another device in the wireless communication network; and
filtering the transmitted amplified signal from the received signal.

13. The method of claim 12, where the received signal is received via at least one of second diversity antenna and a second main antenna.

14. The method of claim 11, where sending the amplified signal includes switching between one of the first diversity antenna or the first main antenna to transmit the output signals.

15. The method of claim 14, where sending the amplified signal includes connecting, to ground, the other one of the first diversity antenna or the first main antenna.

16. The method of claim 11, where the amplified signal includes one of:
wideband carrier division multiple access (WCDMA) signals, or
combined global system for mobile communications/enhanced data rates for global evolution (GSM/EDGE) signals and WCDMA signals.

* * * * *